United States Patent [19]

Shekar et al.

[11] Patent Number: 5,319,222

[45] Date of Patent: * Jun. 7, 1994

[54] MOS GATED THYRISTOR HAVING ON-STATE CURRENT SATURATION CAPABILITY

[75] Inventors: Mallikarjunaswamy S. Shekar; Bantval J. Baliga, both of Raleigh, N.C.

[73] Assignee: North Carolina State University, Raleigh, N.C.

[*] Notice: The portion of the term of this patent subsequent to May 31, 2011 has been disclaimed.

[21] Appl. No.: 875,933

[22] Filed: Apr. 29, 1992

[51] Int. Cl.[5] ............... H01L 29/100; H01L 29/600; H01L 29/740

[52] U.S. Cl. ............... 257/138; 257/139; 257/147

[58] Field of Search ............. 257/139, 140, 142, 144, 257/138, 137

[56] References Cited

U.S. PATENT DOCUMENTS

| | | |
|---|---|---|
| 4,132,996 | 1/1979 | Baliga . |
| 4,165,517 | 8/1979 | Temple et al. . |
| 4,466,173 | 8/1984 | Baliga ............... 29/571 |
| 4,569,118 | 2/1986 | Baliga ............... 29/571 |
| 4,571,815 | 2/1986 | Baliga ............... 29/571 |
| 4,587,712 | 5/1986 | Baliga ............... 29/571 |
| 4,663,547 | 5/1987 | Baliga et al. . |
| 4,799,095 | 1/1989 | Baliga . |
| 4,827,321 | 5/1989 | Baliga . |
| 4,847,671 | 7/1989 | Pattanayak et al. . |
| 4,920,062 | 4/1990 | Tsunoda ............... 257/342 |
| 4,937,644 | 6/1990 | Baliga . |
| 4,942,445 | 7/1990 | Baliga et al. . |
| 4,963,950 | 10/1990 | Chang et al. . |
| 4,969,027 | 11/1990 | Baliga et al. . |
| 4,982,258 | 1/1991 | Baliga . |
| 4,990,975 | 2/1991 | Hagino ............... 257/139 |
| 5,032,881 | 7/1991 | Sardo et al. . |

OTHER PUBLICATIONS

English Translation of Abstract Japan Kokai #53-0123676, Mikio Ootaki, Oct. 28, 1978.
"MOS Controlled Thyristors (MCT'S)"; V. A. K. Temple; 1984 IEDM; General Electric Company, Corporate Research & Dev. Ctr; pp. 282-285.
"The Insulated Gate Transistor: A New Three-Terminal MOS-Controlled Bipolar Power Device"; B. Jayant Baliga et al.; IEEE Transactions on Electron Devices; vol. ED-31, No. 6, Jun. 1984; pp. 821-828.
"The MOS-Gated Emitter Switched Thyristor"; B. Jayant Baliga; IEEE Electron Devices Letters, vol. 11, No. 2, Feb. 1990; pp. 75-77.
"Modern Power Devices"; B. Jayant Baliga; A Wiley-Interscience Publication; John Wiley & Sons; pp. 344-354; 401-404; 367-376.

Primary Examiner—Rolf Hille
Assistant Examiner—David B. Hardy
Attorney, Agent, or Firm—Flehr, Hohbach, Test, Albritton & Herbert

[57] ABSTRACT

An emitter switched thyristor structure providing on-state current saturation capability is disclosed herein. The thyristor structure includes anode and cathode electrodes, and a remote electrode connected to the cathode electrode. A multi-layer body of semiconductor material has a first surface and includes regenerative and non-regenerative portions each operatively coupled between the anode and cathode electrodes. The regenerative portion includes adjacent first, second, third and fourth regions of alternating conductivity type arranged respectively in series, wherein the remote electrode is in electrical contact with the second region and the anode electrode is in electrical contact with the fourth region. The emitter-switched thyristor is turned on by applying an enabling voltage to an insulated gate electrode disposed adjacent the first surface such that a conductive channel is created in the non-regenerative portion via modulation of the conductivity therein. The device may be operated in a saturation mode by reducing the applied gate voltage such that the conductive channel in the non-regenerative portion becomes pinched off. Termination of regenerative operation is initiated by applying a non-enabling voltage to the gate electrode so as to extinguish channel conductivity within the non-regenerative portion as well as within the third region of the regenerative portion. The remote electrode collects any charges remaining in the second region of the regenerative portion subsequent to application of the non-enabling voltage and thereby expedites turn-off of the thyristor device.

15 Claims, 6 Drawing Sheets

FIGURE 1

*PRIOR ART*

*FIGURE 2*

*PRIOR ART*

MOS GATED THYRISTOR HAVING ON-STATE CURRENT SATURATION CAPABILITY

The present invention relates generally to the field of four-layer, latching semiconductor devices, and particularly to methods for controlling the conduction characteristics of such devices by modulating the voltage applied to the gate electrode of a MOSFET portion of the device.

BACKGROUND OF THE INVENTION

The development of power MOSFET's was at least in part motivated by the objective of reducing the control current required by power bipolar devices during forced turn-off. In bipolar devices the injection of minority carriers into their drift region reduces the resistance to forward current flow. These devices are capable of operation at appreciable current densities, but are relatively inefficient as a consequence of the large currents required during device turn-on and turn-off.

In contrast, the gate structure of the power MOSFET has a very high steady-state impedance. This allows control of the device by a voltage source, since only relatively small gate drive currents are required to charge and discharge the input gate capacitance. Unfortunately, the ease of gating the power MOSFET is offset by its high on-state resistance arising from the absence of minority carrier injection. Hence, a combination of low-resistance bipolar-type current conduction with MOS gate control would provide the desired features of high operating forward current density and low gate drive power.

Figure 1:
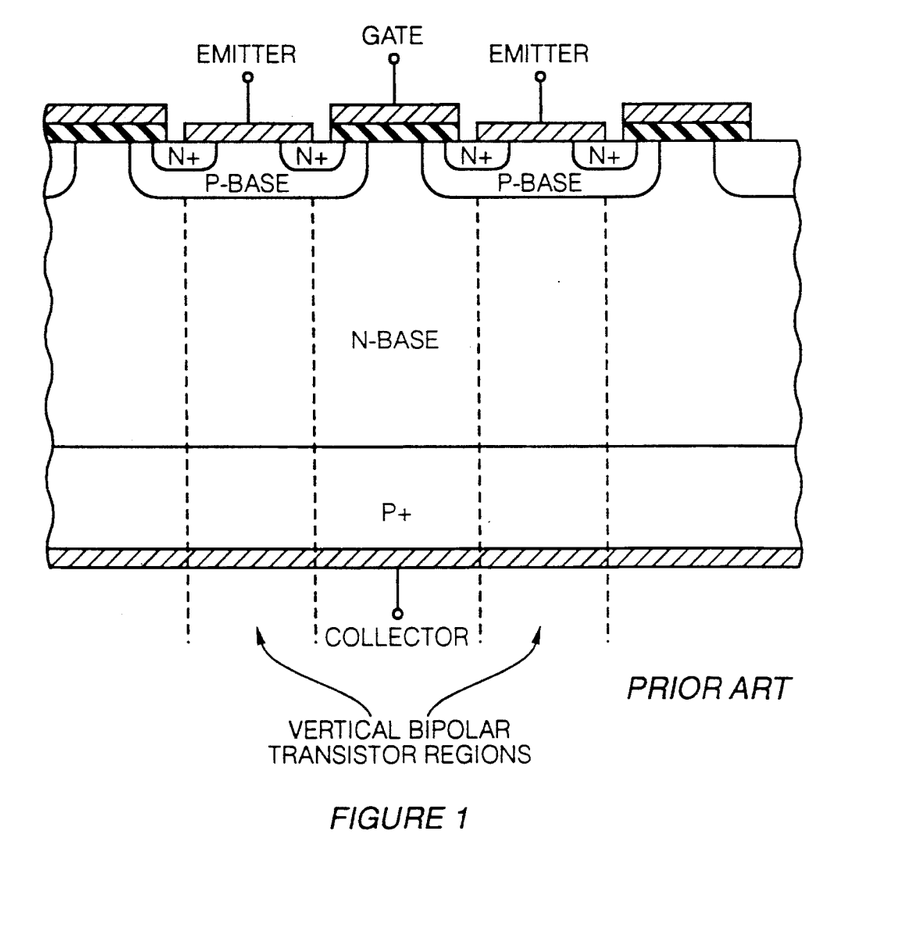
FIG. 1 is a cross-sectional illustration of a conventional insulated gate bipolar transistor (IGBT) device.

Referring to the cross-sectional illustration of FIG. 1, a device known as an insulated gate bipolar transistor (IGBT) illustrates one approach to combining these features. In this type of structure most of the forward current flow occurs between the emitter and collector terminals of the vertical PNP bipolar transistor portion of the device. The on-state losses of the IGBT at high voltages are significantly less than those of power MOSFET's due to the injection of minority carriers (electrons) into the N-base drift region.

Figure 2:
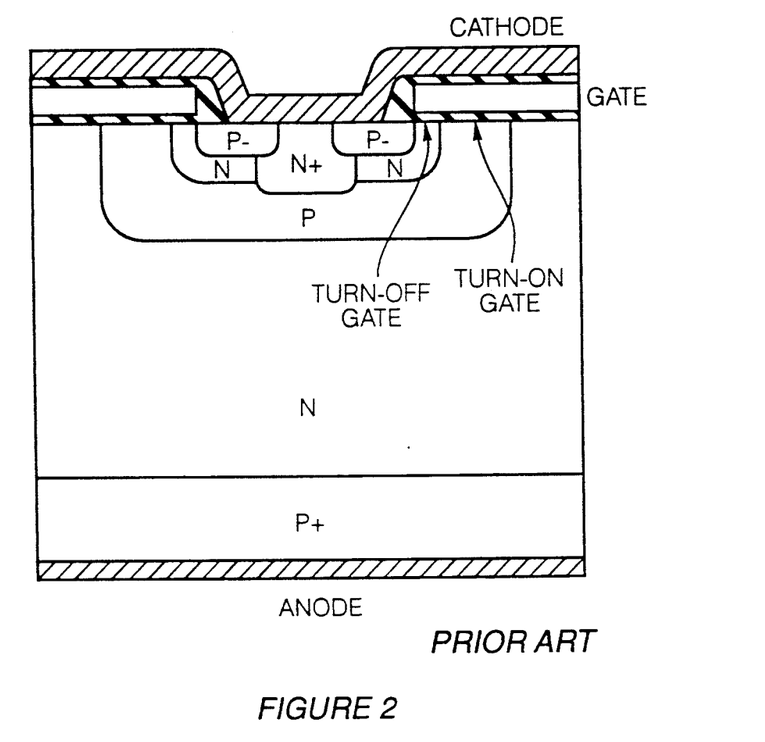
FIG. 2 shows a prior art P-N-P-N regenerative semiconductor device generally known as a MOS-controlled thyristor (MCT).

As shown in FIG. 2, a regenerative device known as MOS-controlled thyristor (MCT) exhibits less forward voltage drop than does the IGBT. This P-N-P-N structure can be regarded as two transistors—an upper NPN transistor and a lower PNP transistor—that are internally connected in such a fashion as to obtain regenerative feedback between each other. Specifically, a thyristor may be considered as a combination of PNP and NPN bipolar transistors connected such that the base of each is driven by the collector current of the other. Once the thyristor is turned on via the gate electrode such that the requisite transistor turn-on current is supplied each transistor then drives the other into saturation. At this juncture the thyristor is no longer under the control of its gate electrode and continues to operate even in the absence of gate drive current—a phenomenon known as regenerative latch-up. Although the large current flow characteristic of regenerative on-state operation may be extinguished by appropriate modification of the gate voltage, the current produced by the MCT may not be adjusted (i.e., "fine-tuned") during regenerative operation through modulation of the gate voltage.

Since thyristors are often used in high-power switching applications, the maximum turn-off current level is generally of considerable importance. The MCT device of FIG. 2 is turned off by reversing the polarity of the applied gate voltage so as to eliminate the accumulation layer at the surface of the N-region embedded between the P and P+ regions underlying the gate. In this way a p-channel field-effect transistor (FET) within the device forms an active short circuit between the N+ cathode and P-base regions. The device will cease regenerative operation when the short-circuit current increases to the extent that the voltage across the N+/P junction falls below 0.7 V. Unfortunately, the maximum current which can be switched off by the MCT markedly decreases with increasing anode voltages at elevated temperatures. As a consequence, the current handling capability of the MCT has proven to be inadequate for particular circuit applications.

Figure 3:
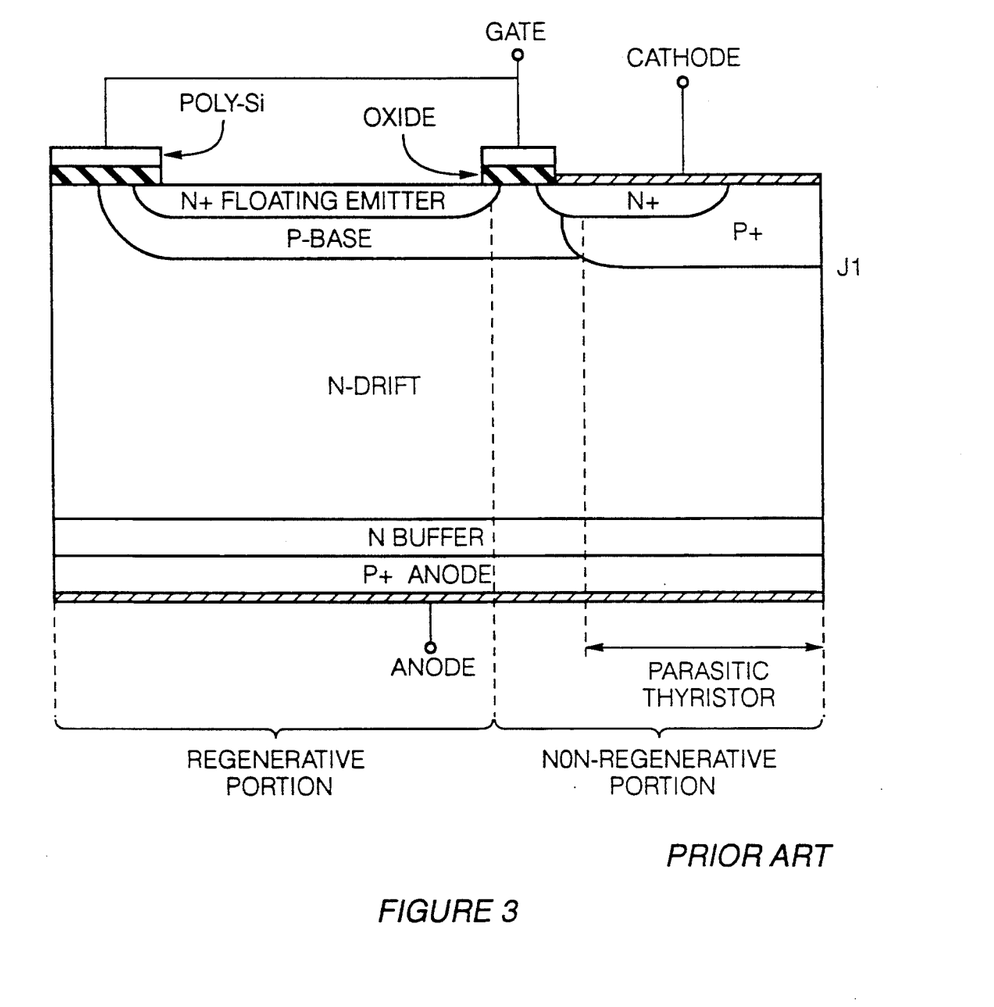
FIG. 3 depicts a conventional implementation of a four-layer MOS gated emitter switched thyristor (EST) semiconductor device.

FIG. 3 depicts a four-layer semiconductor structure, generally termed a MOS gated emitter switched thyristor (EST), also designed to operate in a regenerative mode. When the gate voltage is at the cathode potential the device is in a forward blocking mode with the anode voltage supported across junction J1. The device is turned on by applying a positive bias to the gate to create a channel at the surface of the P-base region. As shown in FIG. 3, the regenerative thyristor portion of the device latches up when the junction between the N+ floating emitter and the P-base becomes forward biased. Regenerative on-state operation is extinguished by reducing the gate bias to zero, effectively disconnecting the emitter from the cathode. Again, however, current flow during on-state operation can be fine-tuned by modulation of the voltage applied to the gate electrode only until the breakdown voltage of the lateral MOSFET is reached. Because the channels of the MOS devices inherent within conventional EST structures are relatively short, the breakdown voltages thereof are typically less than 20 volts.

In addition, the N+/P junction of the conventional EST shown in FIG. 3 does not become reverse biased until the regenerative action of the main thyristor is sufficiently attenuated. It follows that the lateral MOSFET at the surface of the structure is prone to break down during high-voltage device deactivation as a consequence of supporting the large junction voltage. Moreover, the elevated hole current through the cathode which arises during turn-off of the device may induce undesired regenerative operation within a parasitic thyristor (see FIG. 3).

Accordingly, a need in the art exists for an emitter switched thyristor which:

(i) is disposed to be turned off rapidly (i.e., in less than 1 microsecond) without accompanying parasitic latch-up, and which (ii) allows the current provided thereby to be fine-tuned under gate control during regenerative on-state operation.

SUMMARY OF THE INVENTION

The present invention addresses the foregoing objectives by providing an improved emitter switched thyristor structure having on-state current saturation capability and a remote turn-off electrode for reducing for the time required to terminate operation in a regenerative mode. The improved thyristor structure includes anode and cathode electrodes, with the remote electrode being connected to the cathode electrode. A multi-layer body of semiconductor material has a first surface and includes regenerative and non-regenerative portions each operatively coupled between the anode and cathode electrodes. The regenerative portion includes adjacent first, second, third and fourth regions of alternating conductivity type arranged respectively in series. Electrical contact is made between the remote electrode and the second region, as well as between the anode electrode and the fourth region.

The inventive thyristor is turned on by applying an enabling voltage to an insulated gate electrode disposed adjacent the first surface such that a conductive channel is created in the non-regenerative portion via modulation of the conductivity therein. The device may be operated in a saturation mode, in which control is maintained over anode current despite latch-up of the regenerative portion of the device, by reducing the applied gate voltage such that the resistance of the conductive channel in the non-regenerative portion limits the limits the current flow. Termination of regenerative operation is initiated by applying a non-enabling voltage to the gate electrode so as to extinguish channel conductivity within the non-regenerative portion as well as within the third region of the regenerative portion. The remote electrode collects any charges remaining in the second region of the regenerative portion subsequent to application of the non-enabling voltage and thereby expedites turn-off of the inventive thyristor.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENTS

Figure 4:
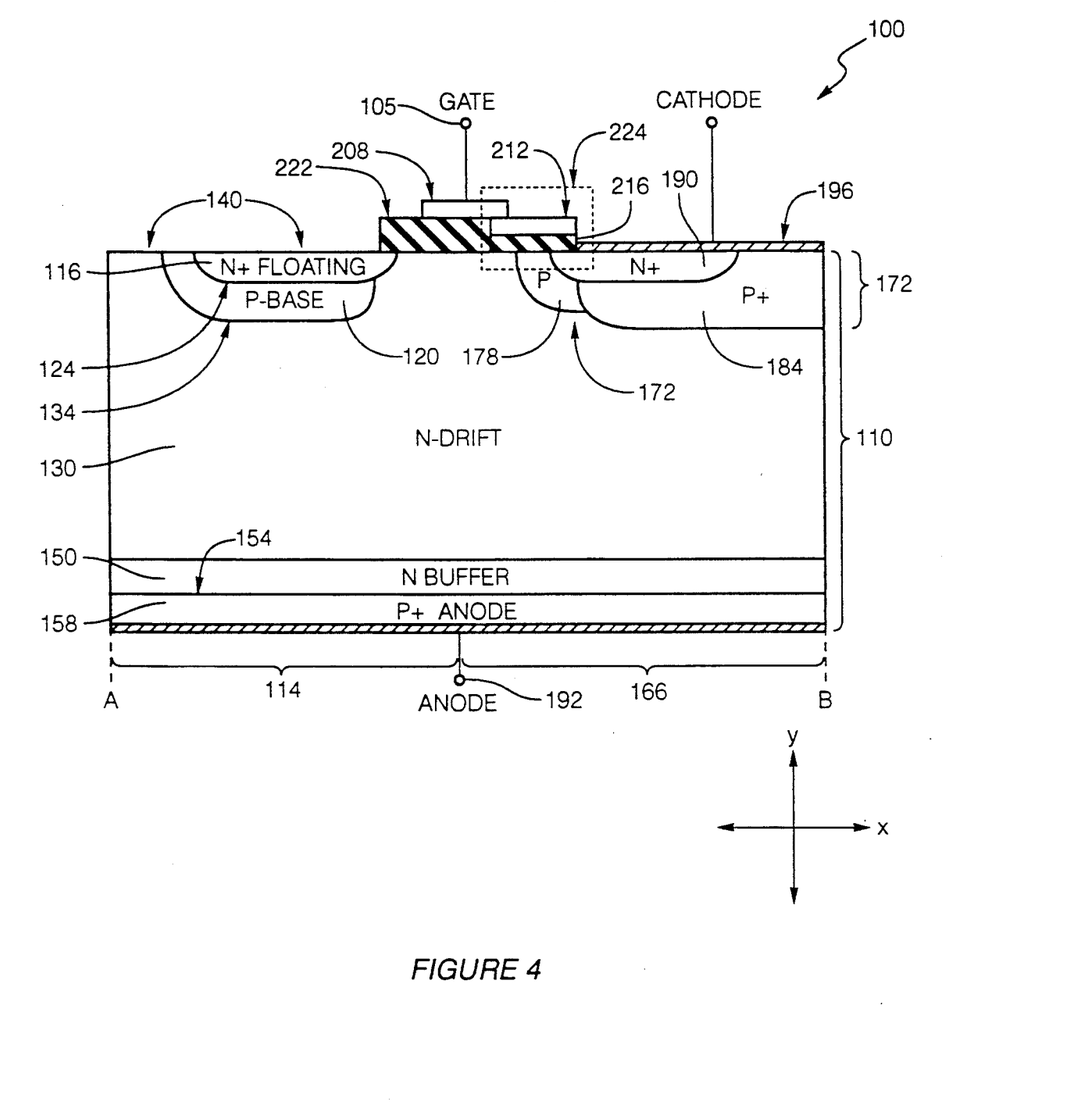
FIG. 4 shows a cross-sectional representation of a preferred embodiment of the inventive emitter switched semiconductor thyristor device having on-state current saturation capability.

Referring to FIG. 4, there is shown a cross-sectional representation of a preferred embodiment of the inventive emitter switched semiconductor thyristor device 100 having on-state current saturation capability. As is discussed hereinafter, the on-state current produced by the inventive thyristor device 100 may be controlled by modulation of the voltage applied to a gate terminal 105 even during operation in a regenerative mode. In order to simplify explanation only a single segment of the inventive thyristor 100 is depicted in FIG. 4. Specifically, by forming the mirror image of the thyristor segment shown in FIG. 4 about reference axes A and B a multi-section device may be created. The thyristor 100 includes a body of semiconductor material 110 having a four layer or regenerative portion 114 constituted by a floating emitter region 116 of N+ conductivity material, and by a base region 120 of P conductivity material forming a first PN junction 124 with the floating emitter 116. A third layer of the regenerative portion of the thyristor device 100 is identified as a drift region 130 consisting of N- semiconductor material adjacent to and forming a second PN junction 134 with the base region 120. As shown in FIG. 4, the semiconductor body 110 is bounded by a substantially planar upper surface 140 defined in part by the uppermost portions of the floating emitter 116, base 120 and drift 130 regions. A set of reference coordinates are included in FIG. 4 and are used in the following description to specify direction.

The drift region 130 includes an optional buffer layer 150 of N-type semiconductor, and separates the base 120 from a fourth or P+ anode layer 158. Adjacent to the four layer, regenerative portion 114 is a three layer, non-regenerative structure 166 comprised of a tri-component cathode region 172, the drift region 130, and the anode region 158. The cathode region 172 includes a well structure consisting of diffusions of P and P+ material 178 and 184, with an N+ diffusion 190 disposed within the well defined by diffusions 178 and 184. Ohmic contacts exist between the lower surface of anode layer 158 and an anode electrode 192, as well as between the upper surface 140 of the P+ and N+ diffusions 184 and 190 and a cathode electrode 196.

Figure 5:
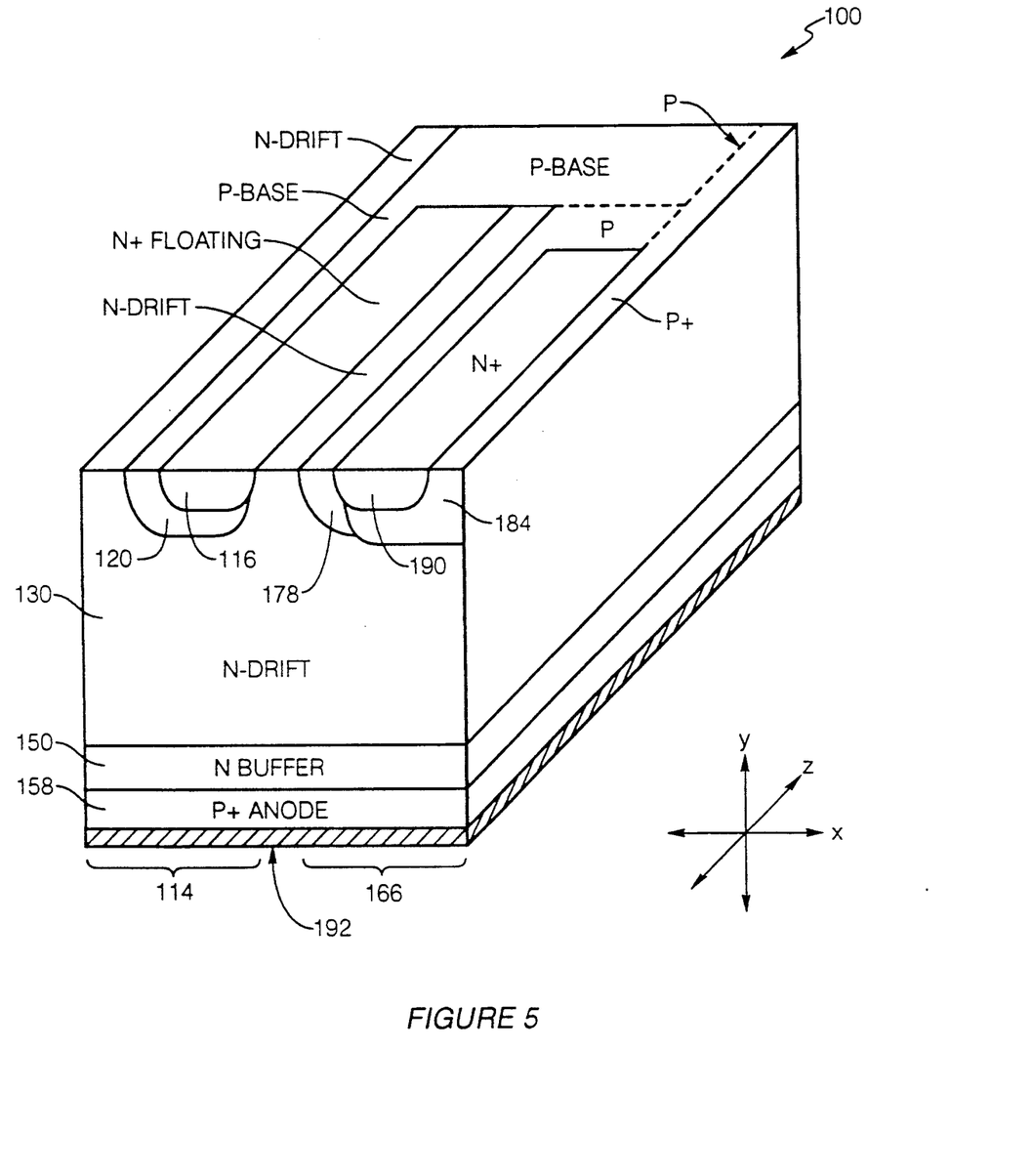
FIG. 5 shows a simplified perspective view of the improved thyristor in which, for purposes of clarity, the oxide and metallization layers above the substrate surface have been omitted from view.

FIG. 5 shows a simplified perspective view of the improved thyristor 100 in which, for purposes of clarity, the oxide and metallization layers above surface 140 have been omitted from view. Each region of the regenerative 114 and non-regenerative portions 166 of the improved thyristor 100 forms an elongated segment in a Z-direction perpendicular to the X-Y plane of FIG. 4. As shown in FIG. 5, the P-base 120 extends in the X-direction and merges with the P+ diffusion 184 in a plane P lying in the Y-Z coordinate plane. In this way an electrical connection is formed between the P-base 120 and the cathode electrode 196 coupled to the P+ diffusion 184.

Again referring to FIG. 4, the gate terminal 105 electrically contacts upper and lower gate electrodes 208 and 212. A thin oxide layer 216 insulates the lower gate electrode 212 from the N+ diffusion 190, P diffusion 178 and drift region 130 so as to form an N-channel enhancement mode MOS field-effect transistor 224. The thickness of the thin oxide layer 216 is typically chosen such that an inversion layer may be formed in the P-type diffusion 178 and base region 120 upon application of a typical gate turn-on bias to the electrode 212. For example, for a thin oxide thickness of 500 angstroms a gate voltage on the order of 5 to 15 volts will lead to creation of a conductive channel within the P-type diffusion 178.

The upper gate electrode 208 serves to improve uniformity in the electric field within the portions of the drift region 130 and floating emitter 116 over which it is positioned. As shown in FIG. 4, the upper electrode 208 is insulated from the drift region 130 and floating emitter 116 by a thick oxide layer 222. The thick oxide 222 is dimensioned so as to be able to support large voltages between the gate electrode 208 and floating emitter 116 during operation in an on-state saturation mode described below. Accordingly, the thickness of oxide layer 222 is generally selected to be approximately ten times that of the thin oxide layers (e.g. 5000 angstroms) in order to avoid oxide breakdown during saturation-mode operation.

With the cathode electrode 196 and gate terminal 105 held at the same potential the thyristor 100 is in a forward blocking mode. In the blocking mode any voltage differential between the anode and cathode electrodes 192 and 196 is primarily supported by the PN junction 134. The device is initially actuated by applying the requisite turn-on voltage to the gate terminal 105. The subsequent formation of a conductive channel at the surface of the P-type diffusion 178 proximate the thin oxide 216 allows electrons to be injected from the N+region 190 into the drift region 130. At these low current levels the thyristor device 100 operates similarly to the conventional IGBT (Insulated Gate Bipolar Transistor) shown in FIG. 1. In IGBT mode operation the current flow through the regenerative portion 114 of the device 100 has not yet become self-sustaining (i.e., latched-up), and hence the anode current remains dependent on the magnitude of the applied gate voltage.

The electrons flowing from the N+region 190 into the drift region 130 serve as base current for the PNP transistor inherent within the four layer regenerative portion 114. When a sufficient voltage is applied to the anode electrode 192 the resulting current flow is adequate to induce regenerative thyristor action (i.e latch-up) within the four layer portion 114. The onset of regenerative action (on-state) is precipitated by the flow of hole current laterally through the base 120 in the Z direction perpendicular to the plane of FIG. 4. The hole current then crosses into P+diffusion 184, and is collected by the cathode 196. During on-state operation the electrons and holes injected into the drift region 130 serve to lower the resistance thereof, thereby increasing the efficiency of the device 100.

In order to facilitate device turn-on the sheet resistivity of the base 120 and length of the emitter 116 in the Z direction are selected to be such that the hole current develops the potential ($\approx$0.7 Volts) required to forward bias the PN junction 124. Specifically, the floating emitter 116 will typically have a length of 20 microns while the sheet resistivity of the base 120 is generally 3000 ohms per square. The drift region 130 is doped at $10^{14}/cm^3$ and such that carrier lifetimes therein are on the order of 1 microsecond. It is noted that the turn-off time of the device 100 is affected by the drift region carrier lifetime. Accordingly, the drift region lifetime may be modified to meet specified turn-off time requirements.

As was discussed in the Background of the Invention, in conventional semiconductor thyristor devices the current flow between the anode and cathode becomes independent of the applied gate voltage subsequent to the onset of thyristor action. That is, once regenerative operation has commenced the gate terminal effectively becomes decoupled from the remainder of the device. It follows that the gate voltage may be allowed to float or be reduced to the cathode potential without affecting anode current flow. In contrast, the inventive thyristor device 100 is configured to facilitate control of the cathode current through modulation of the voltage applied to the gate electrode 105 even after latch-up of regenerative portion 114.

Specifically, the MOS transistor 224 may be placed in a current saturation mode by reducing the voltage applied to gate terminal 105 to approximately the threshold voltage required to create an inversion layer at the surface of P-type diffusion 178. This causes the inversion layer to become highly resistive at the surface of the P-type diffusion 178 proximate the drift region 130 without extinguishing the thyristor current produced by the regenerative portion 114. Since the resistance of the pinched-off channel within P-type diffusion 178 will be dependent upon the applied gate voltage, the flow of electrons from the N+diffusion 190 into the drift region 130 may be controlled by modulation of the gate voltage. Hence, during saturation-mode operation the electron current through the anode 192 is made a function of the applied gate voltage despite thyristor-mode operation of the regenerative portion 114.

As may be appreciated from the foregoing, the range of anode currents supported during saturation-mode operation is dependent upon the magnitude of the voltage applied to gate terminal 105. In particular, lowering the differential between the applied gate voltage and the MOS threshold voltage reduces the anode current in existence when the magnitude of the anode voltage is made sufficient to induce latch-up of the regenerative portion 114. This is the minimum anode current supported during saturation-mode operation. At high anode voltages the electron current through the anode 192 is dominated by the thyristor current of regenerative portion 114, and as a consequence the maximum saturation-mode anode current essentially depends upon the maximum applicable anode voltage. (i.e., upon the maximum voltage which may be supported between the drift region 130 between N+floating region 116 and P diffusion 178). Since the drift region 130 will typically be doped so as to be able to withstand electric fields on the order of $1\times10^5$ to $2\times10^5$ V/cm, and since the potential difference existing between the floating emitter 116 and P diffusion 178 during saturation-mode operation will generally range from 50 to 1000 volts, the drift region 130 will usually be dimensioned to extend approximately 5 to 50 microns from the N+floating region 116 to P diffusion 178. It follows that during saturation-mode operation the anode current swing supported by the thyristor device 100 may be most conveniently controlled by varying the minimum saturation-mode anode current through adjustment of the differential between the applied gate voltage and the threshold voltage of the MOS transistor 224.

When it is desired to terminate thyristor action within the regenerative portion 114 of the device 100 the voltage impressed on the gate electrode 105 is reduced to zero. The surface of the P-type region 178 will preferably be sufficiently narrow (e.g., 2 to 3 microns in the X direction) that reducing the voltage applied to gate electrode 212 will quickly extinguish the conductive channel within the MOS transistor 224, thereby rapidly diminishing regenerative thyristor action.

As may be described with reference to FIG. 3, the structure of conventional EST devices creates a predisposition for parasitic latch-up during turn-off. Specifically, reducing the applied gate voltage in order to initiate deactivation of the device induces a loss of channel conductivity between the N+cathode diffusion and the floating emitter, thereby decoupling the floating emitter from the cathode. The forward bias across the PN junction between the P-base and floating emitter then diminishes as regenerative activity subsides, and an excess hole concentration develops proximate the floating emitter as fewer electrons are injected therefrom into the base. The requirement of charge neutrality forces these holes to the cathode via the P+diffusion, thus resulting in a spike of hole current proximate the PN junction between the diffusions underlying the cathode. If of sufficient magnitude, the current spike may forward bias this PN junction and precipitate latch-up of a parasitic thyristor consisting of the N+diffusion 190 together with a PNP transistor formed by the diffusion 184, drift region 130 and anode layer 158.

The potential of parasitic latch-up during turn-off is reduced within the inventive thyristor 100 as a consequence of the aforementioned merger (FIG. 5) between the base 120 and P+diffusion 184. More specifically, during turn-off of the thyristor 100 holes present within the base 120 will migrate therein normal to the plane of FIG. 4 until encountering the P+cathode diffusion 184 rather than traverse the higher impedance path through drift region 130 to the diffusion 184. Current flow in the vicinity of the PN junction between the diffusions 184 and 190 is thus minimized, and the probability of a turn-off current spike forward biasing this junction and precipitating parasitic latch-up is correspondingly reduced.

Figure 6:
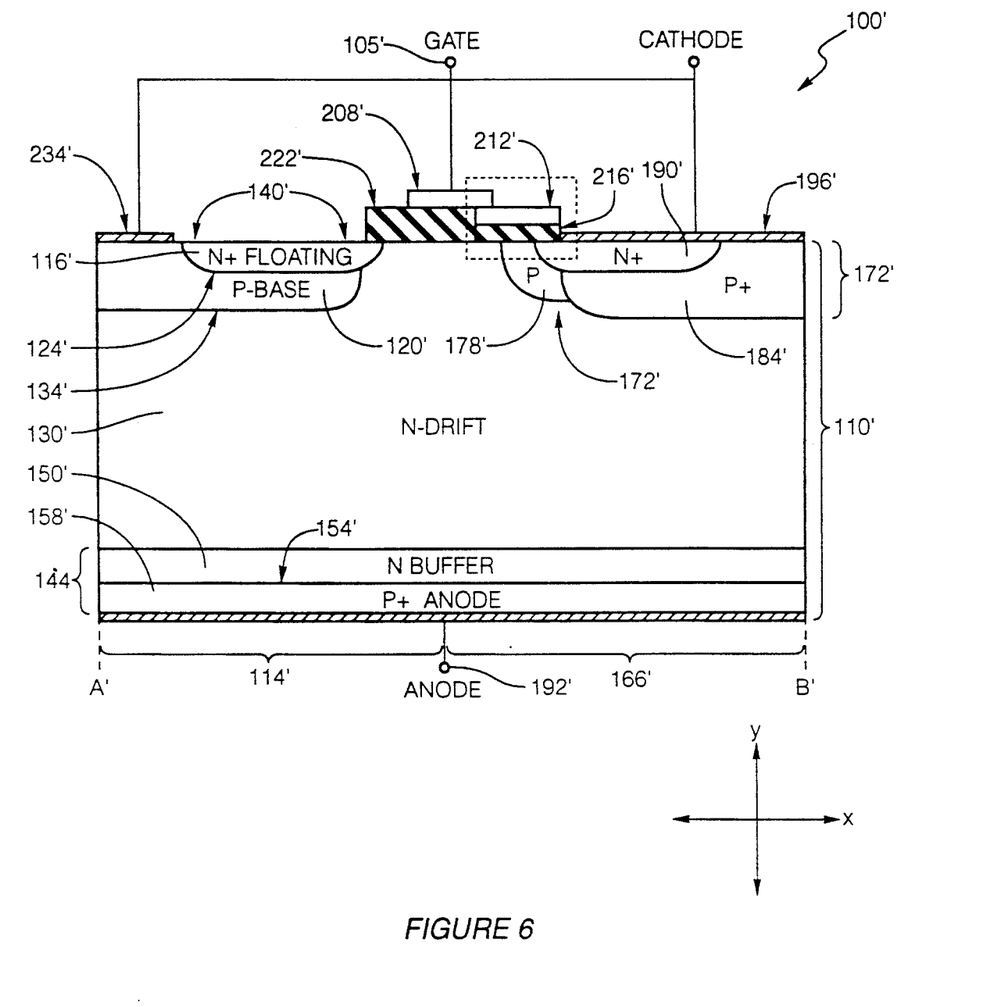
FIG. 6 shows a cross-sectional representation of an alternate preferred embodiment of the present invention having current saturation capability and a remote electrode for improving device turn-off characteristics.

FIG. 6 shows an alternate preferred embodiment of the inventive thyristor device 100' designed to reduce the potential of parasitic latch-up during both on-state operation and during turn-off. The thyristor devices 100' and 100 are structurally identical except within the regenerative region 114 proximate the axis A (FIG. 4). Specifically, in the thyristor device 100' a remote electrode 234' is directly coupled to the surface 140' of the P-base 120'. Additionally, in the embodiment depicted in FIG. 5 the drift region 130' is not interposed between the P-base region 120' and the axis of symmetry A'.

During on-state operation of the device 100' a substantial percentage of the anode current flows vertically through the regenerative portion 114', since it is in this region where the forward bias across PN junction 124' allows a large number of electrons to be injected into the drift region 130' from the floating emitter 116'. Nonetheless, within the non-regenerative region 166' the PNP transistor comprising the diffusion 184', drift region 130' and anode layer 158' also contributes to the on-state current flow. At very high anode current densities (e.g. 1000 A/cm²) it is possible that the parasitic thyristor described above (i.e., PNP transistor in region 166' and N+diffusion 190') will latch up. Through bifurcation of the hole current between the electrodes 194' and 234' the thyristor 100' reduces the likelihood of parasitic latch-up during on-state operation by diminishing the current density proximate the PN junction between the diffusions 184' and 190'.

The remote electrode 234' also serves to expedite turn-off of the device 100' relative to conventional EST structures by facilitating charge removal from the base 120' upon reduction in the potential applied to the gate electrode 105'. As shown in FIG. 3, the only manner in which holes can be drawn from the base region of the conventional EST device depicted therein is through the cathode terminal. It follows that holes present in the regenerative portion proximate the floating emitter must traverse the entire P-base region as well as the P+diffusion in order to be collected by the cathode.

Referring to FIG. 6, the remote electrode 234' serves to reduce any excess hole concentration developing in the base 120' during turn-off of the inventive thyristor device 100'. Specifically, holes present within the regenerative portion 114' at the time of turn-off will migrate along a low-impedance path therein to the remote electrode 234' rather than through the drift region 130' to the cathode electrode 196'. This eliminates the flow of excess holes from the base 120' through the cathode region 172', and hence minimizes the likelihood of undesired parasitic latch-up.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. Specifically, thyristor devices incorporating the teachings of the present invention may be embodied in semiconductor structures which differ from that depicted in FIG. 4. For example, the cathode region need not be realized using the specific arrangement of diffusions specified herein. Those skilled in the art may be aware of other structures for implementing the non-regenerative portion of the inventive thyristor. Similarly, in the preferred embodiments set forth herein the floating emitter regions 116 and 116' will preferably respectively overlap the P-base regions 120 and 120' in the drift region 130' by less than one micron in order to enable the inventive thyristors 100 and 100' to support relatively high forward blocking voltages. In alternative embodiments of the present invention other criteria may be used as a basis for formulating the relative dimensions of specific constituent layers.

What is claimed is:

1. A semiconductor thyristor device comprising:
   a substrate having a drift region extending in a longitudinal direction, a floating emitter region contiguous to said drift region, a base region adjacent said drift region and said floating emitter region, and an anode region adjacent a portion of said drift region distal said base region, said base region being doped with P-type dopants to a first level of dopant concentration;
   a cathode region comprising a P-well adjacent said drift region and an N-region in said P-well, said P-well being doped with P-type dopants to a second level of dopant concentration and merging with said base region in a plane transverse to said longitudinal direction;
   wherein said second level of dopant concentration exceeds said first level of dopant concentration;
   a cathode electrode coupled to said cathode region and separated by said cathode region from said floating emitter region;
   an anode electrode coupled to said anode region; and
   an insulated gate forming a MOS transistor connecting said cathode electrode to said drift region when said MOS transistor is enabled;
   wherein a current path from said anode to said cathode is formed by said MOS transistor during regenerative operation in a regenerative mode, said regenerative operation being precipitated by application of an enabling voltage to said insulated gate, and wherein, when a non-enabling voltage is applied to said MOS transistor said current path is extinguished and any charges remaining in said base region flow through said P-well to said cathode electrode.

2. The semiconductor device of claim 1 wherein said insulated gate includes:
   a gate electrode,
   a thin oxide layer interposed between said gate electrode and said cathode region, and a thick oxide layer interposed between said gate electrode and said floating emitter region.

3. The semiconductor device of claim 2 wherein a portion of said current path comprises a conductive channel underlying said thin oxide layer, said channel becoming pinched-off during operation in said regenerative mode when a saturation-mode control voltage is applied to said first insulated gate, said semiconductor device further including means for modulating said saturation-mode control voltage applied to said gate electrode so as to control current flow through said cathode electrode during pinch-off of said conductive channel.

4. The semiconductor device of claim 2 wherein conductivity of a first portion of said drift region interposed between said floating emitter and cathode regions is modulated when said thyristor is operative in a regenerative mode;
whereby said first portion of said drift region serves to control resistance between said anode and cathode electrodes during operation in said regenerative mode.

5. The semiconductor device of claim 4 wherein said thick and thin oxide layers both overlap said first portion of said drift region.

6. A semiconductor thyristor device comprising:
a substrate forming a drift region, a floating emitter region contiguous to said drift region, a base region doped with P-type dopants to a first level of dopant concentration, said base region being formed adjacent said drift region and said floating emitter region, and an anode region adjacent a portion of said drift region distal said base region;
a cathode region comprising a P-well adjacent said drift region and an N-region in said P-well, said P-well being doped with P-type dopants to a second level of dopant concentration;
wherein said second level of dopant concentration exceeds said first level of dopant concentration;
a first cathode electrode coupled to said cathode region;
an anode electrode coupled to said anode region;
an insulated gate forming a MOS transistor connecting said first cathode electrode to said drift region when said MOS transistor is enabled; and
a remote cathode electrode, electrically coupled to said first cathode electrode and to said base region, for collecting charge carriers from said base region;
wherein a current path from said anode region to said cathode region is formed by said MOS transistor during operation in a regenerative mode, said regenerative operation being precipitated by application of an enabling voltage of said insulated gate, and wherein, when a non-enabling voltage is applied to said insulated gate said current path is extinguished and any charges remaining in said base region are collected by said remote electrode.

7. The semiconductor device of claim 6 wherein said insulated gate includes:
a gate electrode,
a thin oxide layer interposed between said gate electrode and said cathode region, and
a thick oxide layer interposed between said gate electrode and said floating emitter region.

8. The semiconductor device of claim 7 wherein a portion of said current path comprises a conductive channel underlying said thin oxide layer, said channel becoming pinched-off during operation in said regenerative mode when a saturation-mode control voltage is applied to said gate electrode,
said semiconductor device further including means for modulating voltage applied to said gate electrode so as to control current flow through said cathode electrode during pinch-off of said conductive channel.

9. The semiconductor device of claim 8 further including means for modulating conductivity of a first portion of said drift region interposed between said floating emitter and cathode regions so as to control resistance between said anode and cathode electrodes when said thyristor is operative in said regenerative mode.

10. The semiconductor device of claim 9 wherein said thick and thin oxide layers both overlap said first portion of said drift region.

11. A semiconductor thyristor device comprising:
anode and cathode electrodes;
a remote electrode electrically coupled to said cathode electrode;
a multi-layer body of semiconductor material having a first surface and including a regenerative portion and a non-regenerative portion each operatively coupled between said anode and cathode electrodes, said regenerative portion including adjacent first, second, third and fourth regions of alternating conductivity type arranged respectively in series wherein said first region of said regenerative portion is contiguous to said third region, and wherein said remote electrode is in electrical contact with said second region and is separated from said first region thereby, and wherein said anode electrode is in electrical contact with said fourth region; and
an insulated gate electrode disposed adjacent said first surface for modulating electrical conductivity within said non-regenerative portion in order to turn said device on upon application of an enabling voltage to said gate electrode, and for modulating electrical conductivity within said third region of said regenerative portion and within said non-regenerative portion in order to turn said device off upon application of a non-enabling voltage to said gate electrode;
wherein any charges remaining in said second region of said regenerative portion are collected by said remote electrode subsequent to said application of said non-enabling voltage to said gate electrode.

12. The semiconductor device of claim 11 wherein said third region separates said second region and said non-regenerative portion adjacent said insulated gate electrode.

13. The semiconductor device of claim 12 wherein said non-regenerative portion includes a cathode region having a P-well adjacent said drift region and an N-region in said P-well, said cathode electrode being connected to said P-well and to said N-region.

14. The semiconductor device of claim 13 wherein a conductive channel is created in said P-well adjacent a thin oxide portion of said insulated gate upon application of an enabling voltage thereto, said conductive channel becoming pinched off upon application of a saturation voltage of said insulated gate.

15. A semiconductor thyristor device comprising:
anode and cathode electrodes;
a remote electrode;

a multi-layer body of semiconductor material having a first surface and including a regenerative portion and a non-regenerative portion each operatively coupled between said anode and cathode electrodes, said regenerative portion including adjacent first, second, third and fourth regions of alternating conductivity type arranged respectively in series wherein said first region of said regenerative portion is contiguous to said third region, and wherein said remote electrode is in electrical contact with said second region and said anode electrode is in electrical contact with said fourth region;

an insulated gate forming a MOS transistor adjacent said first surface connecting said cathode electrode to said third region when said MOS transistor is enabled; and a remote cathode electrode, electrically coupled to said first cathode electrode and to said second region, said remote electrode being separated from said first region of said regenerative portion by said second region, for collecting charge carriers from said second region;

wherein a current path from said anode to said cathode is formed by said MOS transistor during operation in a regenerative mode, said regenerative operation being precipitated by application of an enabling voltage to said insulated gate, and wherein, when a non-enabling voltage is applied to said MOS transistor said current path is extinguished and any charges remaining in said base region flow through said P-well to said cathode electrode.

* * * * *